United States Patent
Li

(10) Patent No.: US 10,943,761 B2
(45) Date of Patent: Mar. 9, 2021

(54) SYSTEM FOR EVACUATING A CHAMBER

(71) Applicant: ASML Netherlands B.V., Veldhoven (NL)

(72) Inventor: Fangfu Li, San Jose, CA (US)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/492,095

(22) PCT Filed: Mar. 2, 2018

(86) PCT No.: PCT/EP2018/055210
§ 371 (c)(1),
(2) Date: Sep. 6, 2019

(87) PCT Pub. No.: WO2018/162358
PCT Pub. Date: Sep. 13, 2018

(65) Prior Publication Data
US 2020/0105496 A1    Apr. 2, 2020

Related U.S. Application Data

(60) Provisional application No. 62/534,032, filed on Jul. 18, 2017, provisional application No. 62/467,994, filed on Mar. 7, 2017.

(51) Int. Cl.
*H01J 37/18* (2006.01)
*F04D 19/04* (2006.01)
*F04D 25/16* (2006.01)

(52) U.S. Cl.
CPC ........... *H01J 37/18* (2013.01); *F04D 19/042* (2013.01); *F04D 25/16* (2013.01); *H01J 2237/002* (2013.01); *H01J 2237/1825* (2013.01)

(58) Field of Classification Search
CPC ...... H01J 37/18; H01J 37/20; H01J 2237/002; H01J 2237/1825; F04D 19/042; F04D 25/16
See application file for complete search history.

(56) References Cited

U.S. PATENT DOCUMENTS 5,513,499 A * 5/1996 deRijke ............... F04B 37/085
                                                            62/55.5
7,804,578 B2    9/2010 Miyazaki
(Continued)

FOREIGN PATENT DOCUMENTS

JP           10121224 A *  5/1998

OTHER PUBLICATIONS

Day, C. (2006) Basics and applications of cryopumps. CAS-CERN Accelerator School and ALBA Synchrotron Light Facility: Course on Vacuum in Accelerators, Platja d'Aro, Spain, p. 241.
(Continued)

*Primary Examiner* — David E Smith
(74) *Attorney, Agent, or Firm* — Finnegan, Henderson, Farabow, Garrett & Dunner, LLP

(57) ABSTRACT

Systems and methods are provided for evacuating a chamber 101. The evacuation system comprises a cooler 320 coupled with the chamber and a controller 350. The controller is configured to determine whether a property of the cooler or the chamber satisfies one or more conditions. Based on the determination that the property satisfies the one or more conditions, the controller is configured to isolate the cooler from the chamber or control the temperature of the cooler to increase at one or more rates. The controller is further configured to control one or more pumps 330,340 to pump the chamber to a base pressure value.

14 Claims, 8 Drawing Sheets

(56) References Cited

U.S. PATENT DOCUMENTS

| | | | | |
|---|---|---|---|---|
| 2001/0012485 A1* | 8/2001 | Gaudet | ............... | F04B 49/065 417/53 |
| 2012/0285182 A1* | 11/2012 | Ando | ............... | B01D 8/00 62/55.5 |
| 2012/0304669 A1* | 12/2012 | Kimura | ............... | F04B 49/065 62/55.5 |
| 2015/0267693 A1* | 9/2015 | Oikawa | ............... | F04B 37/085 62/55.5 |
| 2016/0240345 A1* | 8/2016 | Frosien | ............... | H01J 37/065 |

OTHER PUBLICATIONS

Office Action issued from the Taiwanese Intellectual Property Office Patent Application No. 107107401, dated Jan. 2, 2019 (9 pages).

\* cited by examiner

SYSTEM FOR EVACUATING A CHAMBER

CROSS-REFERENCE TO RELATED APPLICATIONS

This application is a national stage filing under 35 U.S.C. § 371 of International Application No. PCT/EP2018/055210, filed on Mar. 2, 2018, and published as WO 2018/162358 A1, which claims priority of U.S. Provisional Application No. 62/467,994, which was filed on Mar. 7, 2017; and U.S. Provisional Application No. 62/534,032, which was filed on Jul. 18, 2017, all of these applications are incorporated herein by reference in their entireties.

TECHNICAL FIELD

The present disclosure generally relates to the field of vacuum systems, and more particularly, to systems and methods for evacuating a chamber.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to a sub-100 or even sub-10 nanometers, inspection systems capable of higher resolution than those utilizing optical microscopes are needed.

A charged particle (for example, an electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With an SEM, electrons of a single primary electron beam, or electrons of a plurality of primary electron beams, can be focused at one or more scan locations of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and/or external structures of the wafer.

At atmospheric pressure, the charged particles (e.g., electrons) suffer frequent collisions with gas molecules and are deflected from their path. The mean free path of charged particles at atmospheric pressure can be too small for practical inspection applications. A chamber housing a charged particle beam microscope is therefore evacuated to a base pressure value before using the charged particle beam for inspection. The base pressure can be any low pressure value (or high vacuum level) compared with atmospheric pressure. The base pressure needed before performing inspection can vary based on the specific microscope system and the specific application the system is used for. A chamber may also need to be evacuated to low base pressure values for other applications, for example, lithography, vapor deposition, reactive ion etching, etc.

An evacuation system is used to evacuate a chamber to base pressure. The performance of the evacuation system can be evaluated based on the lowest base pressure (or highest vacuum level) that can be achieved and the time duration needed to achieve the base pressure. The pressure within the chamber may be raised to atmospheric pressure during maintenance or repair activities. Further, various atmospheric gases may be adsorbed on surfaces within the chamber, when the surfaces are exposed to atmosphere. After the maintenance and repair activities are complete, the chamber is evacuated to base pressure. Further, various applications (e.g., charged particle beam inspection) cannot be performed until the chamber evacuation to base pressure is complete. Therefore, any delays associated with evacuating the chamber can lead to a degradation of availability of the chamber for useful applications.

SUMMARY

Embodiments of the present disclosure provide systems and methods for evacuating a chamber. In some embodiments, an evacuation system is provided. The system comprises a cooler coupled with a chamber and a controller. The controller can be configured to determine whether a property of the cooler or the chamber satisfies one or more conditions. The controller can be further configured to, based on the determination that the property satisfies the one or more conditions, control the temperature of the cooler to increase at one or more rates and control one or more pumps to pump the chamber to a base pressure value.

In some embodiments, an evacuation system is provided. The system comprises a cooler coupled with a chamber and a controller. The controller can be configured to determine whether a property of the cooler or the chamber satisfies one or more conditions. The controller can be further configured to, based on the determination that the property satisfies the one or more conditions, isolate the cooler from the chamber and control one or more pumps to pump the chamber to a base pressure value.

In some embodiments, a method is provided. The method comprises determining whether a property of a cooler coupled with a chamber or the chamber satisfies one or more conditions. The method further comprises, based on the determination that the property satisfies the one or more conditions, controlling the temperature of the cooler to increase at one or more rates and controlling one or more pumps to pump the chamber to a base pressure value.

In some embodiments, a method is provided. The method comprises determining whether a property of a cooler coupled with a chamber or the chamber satisfies one or more conditions. The method further comprises, based on the determination that the property satisfies the one or more conditions, isolating the cooler from the chamber and controlling one or more pumps to pump the chamber to a base pressure value.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Figure 1:
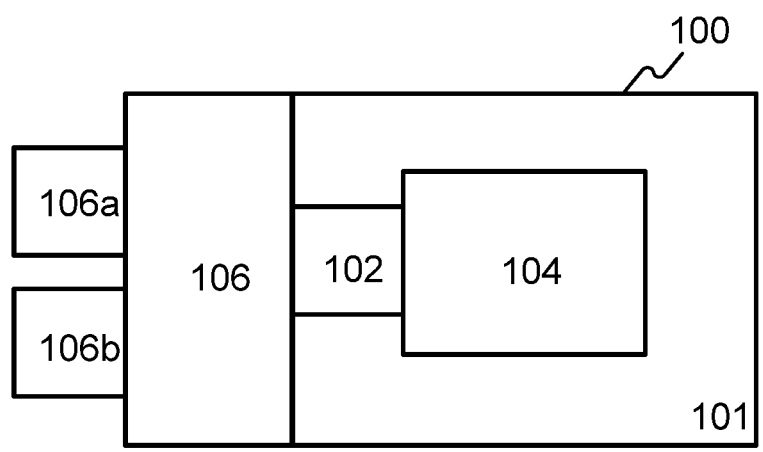
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The present disclosure relates to systems and methods for evacuation of a chamber. The chamber can be evacuated to base pressure using a roughing pump and a high vacuum pump, such as a turbomolecular pump. The roughing pump can be used to evacuate the chamber from an atmospheric pressure to a rough vacuum level (e.g., chamber pressure of $10^{-3}$ torr). The turbomolecular pump can be used to further evacuate the chamber to a high vacuum level (e.g., base pressure of $10^{-6}$ torr). The turbomolecular pump can be a propellant pump, comprising a rotodynamic pump and a driving gas turbine, and pumps out gas molecules that arrive at its pumping orifice. The pumping speed of the turbomolecular pump is therefore limited by the arrival rate of gas molecules at its orifice. This can result in long time durations for evacuating the chamber to base pressure (e.g., a time duration of 20 hours for evacuating an exemplary system housing an electron beam inspection microscope). The long evacuation time reduces the availability of the chamber for useful applications.

Embodiments of the present disclosure provide a system comprising a cooler coupled to a chamber, and a controller. A reduction in temperature of the cooler can trap gas molecules from the chamber within the cooler. This can reduce the time needed for evacuation of the chamber to base pressure. The speed of evacuation of the chamber and the availability of the chamber for useful operations can both be improved as a result. In some embodiments, the mechanical vibrations associated with the cooler can interfere with regular operations of the chamber (e.g., the vibrations can cause an error in the inspection location of an electron beam inspection tool housed within the chamber). The controller can therefore switch off the cooler operation based on the temperature of the cooler or pressure of the chamber satisfying one or more conditions (e.g., pressure of a chamber housing a SEM is lower than base pressure needed for SEM operation). As the temperature of the cooler increases, some of the trapped gas molecules within the cooler can be released back into the chamber. The controller can control the rate of increase of the cooler temperature to control the associated spike in chamber pressure caused by the trapped gas molecules released from the cooler. The controller can further control the rate of increase of the cooler temperature so that the turbomolecular pump can pump out a portion of the trapped gas molecules released by the cooler. In some embodiments, based on the satisfaction of the one or more conditions, the controller can isolate the cooler from the chamber so that the gas molecules trapped within the cooler cannot be released back into the chamber. With such arrangements, the disclosed embodiments can reduce the time duration of evacuation of the chamber to base pressure and improve availability of the chamber for useful operations.

Reference is now made to FIG. 1, which illustrates an exemplary electron beam inspection (EBI) system 100 consistent with embodiments of the present disclosure. As shown in FIG. 1, EBI system 100 includes a main chamber 101, a load/lock chamber 102, an electron beam tool 104, and an equipment front end module (EFEM) 106. Electron beam tool 104 is located within main chamber 101.

EFEM 106 includes a first loading port 106a and a second loading port 106b. EFEM 106 may include additional loading port(s). First loading port 106a and second loading port 106b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 106 transport the wafers to load/lock chamber 102.

Load/lock chamber 102 is connected to a load/lock vacuum pump system (not shown), which removes gas molecules in load/lock chamber 102 to reach a first pressure below the atmospheric pressure. After reaching the first pressure, one or more robot arms (not shown) transport the wafer from load/lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to inspection by electron beam tool 104. While the present disclosure provides examples of main chamber 101 housing an electron beam inspection system, it should be noted that aspects of the disclosure in their broadest sense, are not limited to a chamber housing an electron beam inspection system. Rather, it is appreciated that the forgoing principles may be applied to other chambers as well.

Figure 2:
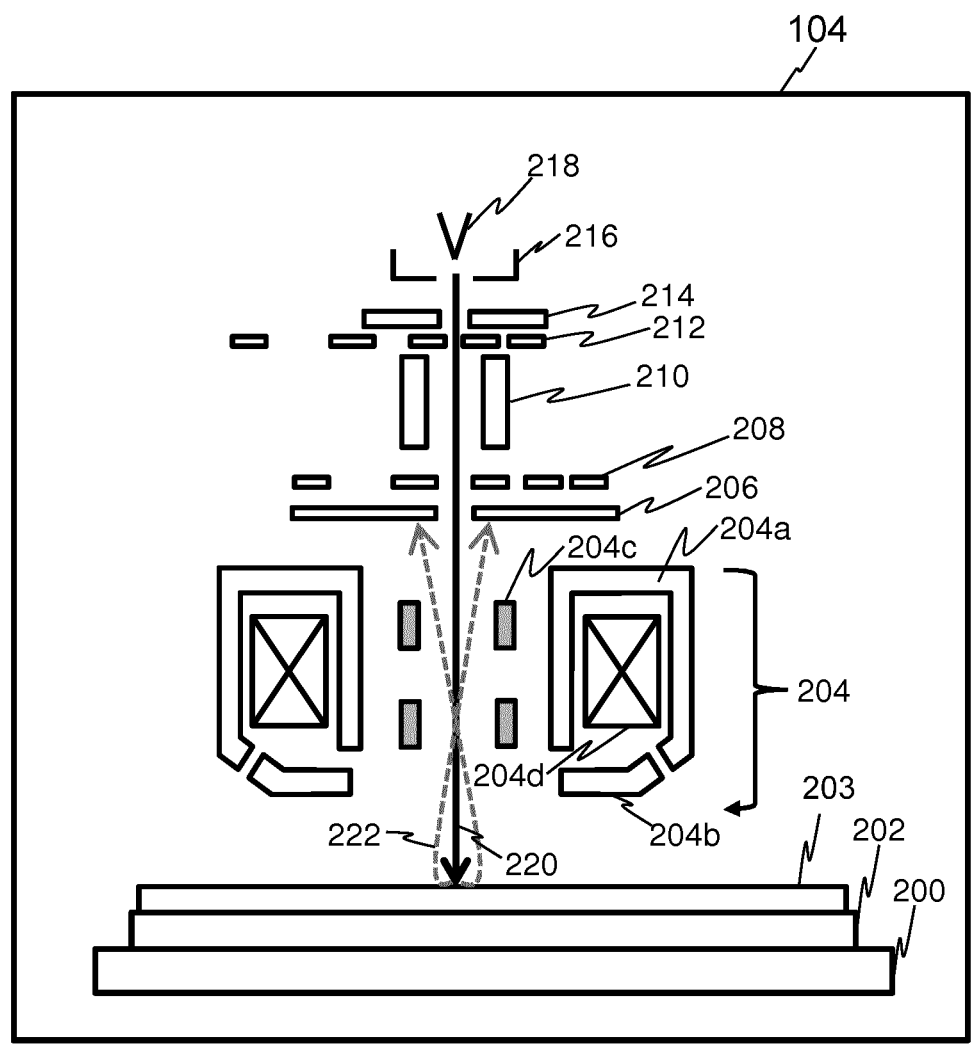
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates exemplary components of electron beam tool 104 consistent with embodiments of the present disclosure. As shown in FIG. 2, electron beam tool 104 includes a motorized stage 200, and a wafer holder 202 supported by motorized stage 200 to hold a wafer 203 to be inspected. Electron beam tool 104 further includes an objective lens assembly 204, electron detector 206, an objective aperture 208, a condenser lens 210, a beam limit aperture 212, a gun aperture 214, an anode 216, and a cathode 218. Objective lens assembly 204, in some embodiments, can include a modified swing objective retarding immersion lens (SORIL), which includes a pole piece 204a, a control electrode 204b, a deflector 204c, and an exciting coil 204d. Electron beam tool 104 may additionally include an energy dispersive X-ray spectrometer (EDS) detector (not shown) to characterize the materials on the wafer.

A primary electron beam 220 is emitted from cathode 218 by applying a voltage between anode 216 and cathode 218. Primary electron beam 220 passes through gun aperture 214 and beam limit aperture 212, both of which can determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c can be controlled to deflect primary electron beam 220 sequentially onto different locations of top surface of wafer 203 at different time points, to provide data for image reconstruction for different parts of wafer 203. Further, in some embodiments, anode 216 and cathode 218 can be configured to generate multiple primary electron beams 220, and electron beam tool 104 can include a plurality of deflectors 204c to project the multiple primary electron beams 220 to different portions of the wafer at the same time, to provide data for image reconstruction for different portions of wafer 203.

Exciting coil 204d and pole piece 204a generate a magnetic field that begins at one end of pole piece 204a and terminates at the other end of pole piece 204a. A part of wafer 203 being scanned by primary electron beam 220 can be immersed in the magnetic field and can be electrically charged, which, in turn, creates an electric field. The electric field reduces the energy of impinging primary electron beam 220 near the surface of the wafer before it collides with the wafer. Control electrode 204b, being electrically isolated from pole piece 204a, controls an electric field on the wafer to prevent micro-arching of the wafer and to ensure proper beam focus.

A secondary electron beam 222 can be emitted from the part of wafer 203 upon receiving primary electron beam 220. Secondary electron beam 222 can form a beam spot on sensor surfaces of electron detector 206. Electron detector 206 can generate a signal (e.g., a voltage, a current, etc.) that represents an intensity of the beam spot, and provide the signal to a processing system (not shown in FIG. 2). The intensity of secondary electron beam 222, and the resultant beam spot, can vary according to the external and/or internal structure of wafer 203. Moreover, as discussed above, primary electron beam 220 can be projected onto different locations of the surface of the wafer, to generate secondary electron beams 222 (and the resultant beam spot) of different intensities. Therefore, by mapping the intensities of the beam spots with the locations of wafer 203, the processing system can reconstruct an image that reflects the internal and/or external structures of wafer 203.

Figure 3:
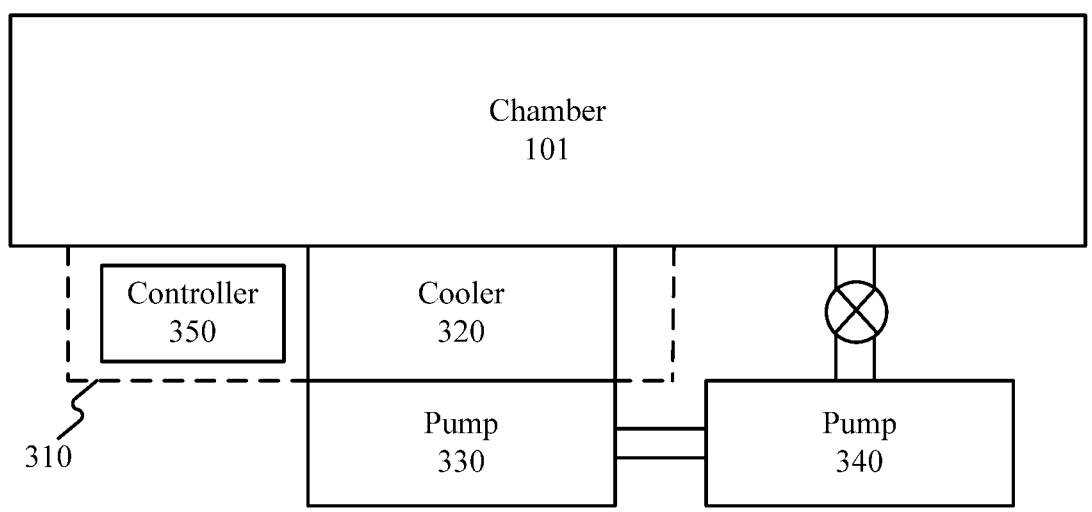
FIG. 3 is a schematic diagram illustrating an exemplary system for evacuating a chamber, consistent with embodiments of the present disclosure.

Reference is now made to FIG. 3, which is a schematic diagram illustrating an exemplary system 310 for evacuating a chamber (e.g., chamber 101), consistent with embodiments of the present disclosure. System 310 can comprise a controller 350, and a cooler 320 coupled to chamber 101. A cooler, in accordance with this disclosure, may comprise a cooling element suspended within the chamber. In some embodiments, a cooler may include a cooling gas or fluid in thermal contact with a portion of the chamber. In some embodiments, a cooler can comprise a cooling element and compartment coupled to the chamber. A controller, in accordance with this disclosure, may comprise a control module. In general, the word "module," as used herein, can be a packaged functional hardware unit designed for use with other components (for example, portions of an integrated circuit) or a part of a program (stored on a computer readable medium) that performs a particular function of related functions. The module can have entry and exit points and can be written in a programming language, such as, for example, Java, Lua, C or C++. A software module can be compiled and linked into an executable program, installed in a dynamic link library, or written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, cache, register, or any other non-transitory medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in firmware, such as an EPROM. It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware. Generally, the modules described herein refer to logical modules that can be combined with other modules or divided into sub-modules despite their physical organization or storage.

Chamber 101 can also be coupled to a roughing pump, for example, pump 340. Pump 340 can be configured to evacuate chamber 101 from a high pressure (e.g., atmospheric pressure) to a rough vacuum level (e.g., chamber pressure of $10^{-3}$ torr). A reduction in temperature of cooler 320 can reduce pressure of gas molecules within cooler 320 and draw in gas molecules from chamber 101 into cooler 320. Cooler 320 can therefore speed up evacuation of chamber 101 by drawing in gas molecules from chamber 101 and trapping them within cooler 320. In some embodiments, controller 350 can be configured to control the reduction in temperature of cooler 320.

In some embodiments, mechanical vibrations associated with operation of cooler 320 may interfere with applications of chamber 101. For example, the vibrations can interfere with operation of electron beam tool 104 housed within chamber 101. Controller 350 can be configured to determine whether a property of cooler 320 or chamber 101 satisfies one or more conditions. For example, the property being monitored can be a temperature of cooler 320 or a pressure within chamber 101. The determined condition can be whether the temperature of cooler 320 is below a threshold temperature or whether the pressure within chamber 101 is below a threshold pressure. Controller 350 can be further configured to stop cooling operation of cooler 320 (and eliminate associated vibrations) based on the satisfaction of the one or more conditions. For example, controller 350 can stop cooling operation of cooler 320 in response to the temperature of cooler 320 falling below a threshold temperature of 65K. In another example, controller 350 can stop cooling operation of cooler 320 in response to the pressure within chamber 101 falling below a threshold pressure of $10^{-3}$ torr.

Chamber 101 can also be coupled to a high vacuum pump, for example, pump 330. In some embodiments, pump 330 can be coupled to chamber 101 in parallel with cooler 320. In other embodiments, pump 330 can be coupled to chamber 101 in series with cooler 320 (as shown in FIG. 3). Pump 330 can be any high vacuum pump configured to evacuate chamber 101 from a rough vacuum level (e.g. $10^{-3}$ torr) to a high vacuum level (e.g. base pressure of $10^{-6}$ torr). In some embodiments, pump 330 can be a turbomolecular pump. Based on the satisfaction of the one or more conditions described above, a controller (e.g. controller 350) can be configured to control pump 330 to evacuate chamber 101 from rough vacuum to base pressure.

Based on the satisfaction of one or more conditions (as described above), controller 350 can stop the cooling operation of cooler 320. As temperature of cooler 320 increases to ambient temperature, the trapped gas molecules within cooler 320 can escape back into chamber 101. This can cause the vacuum level within chamber 101 to fall below a minimum vacuum level needed for some applications (e.g., wafer inspection using electron beam tool 104 housed within chamber 101).

Figure 4A:
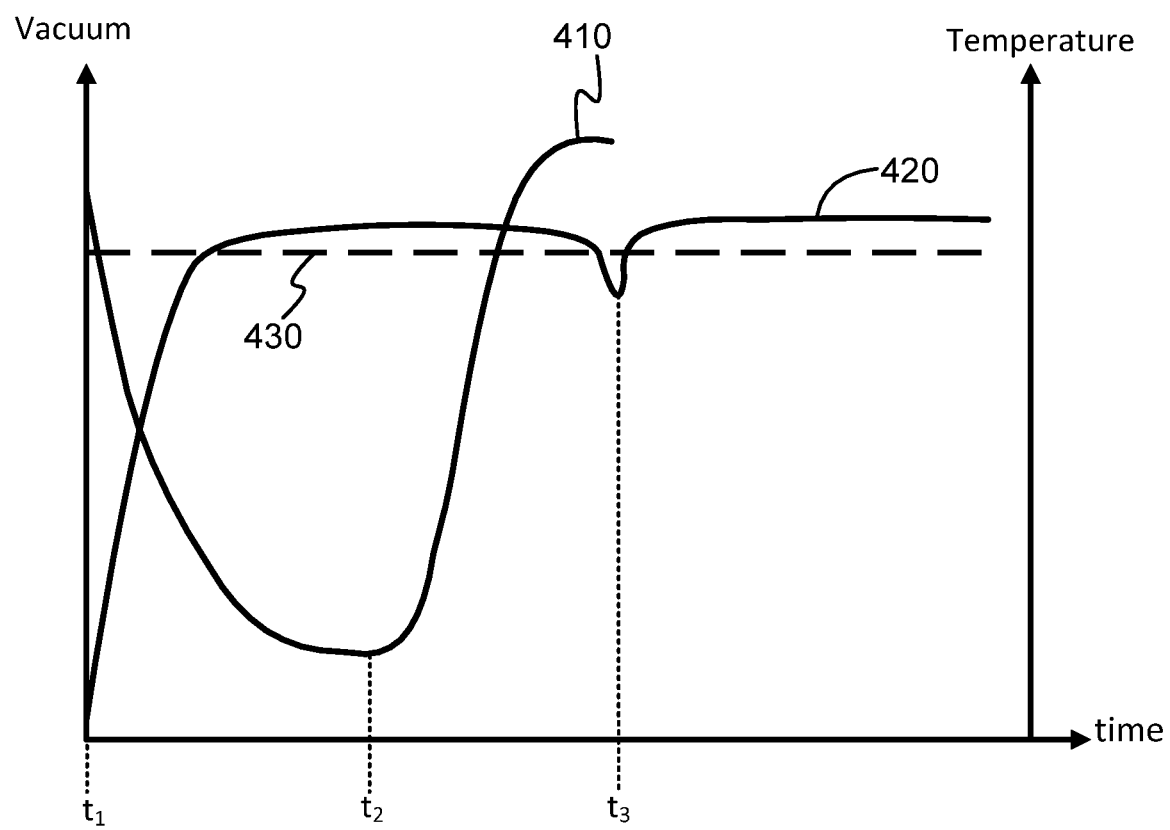
FIGS. 4A, 4B are graphs illustrating exemplary values of chamber vacuum levels and cooler temperature during evacuation of the chamber, consistent with embodiments of the present disclosure.
Figure 4B:
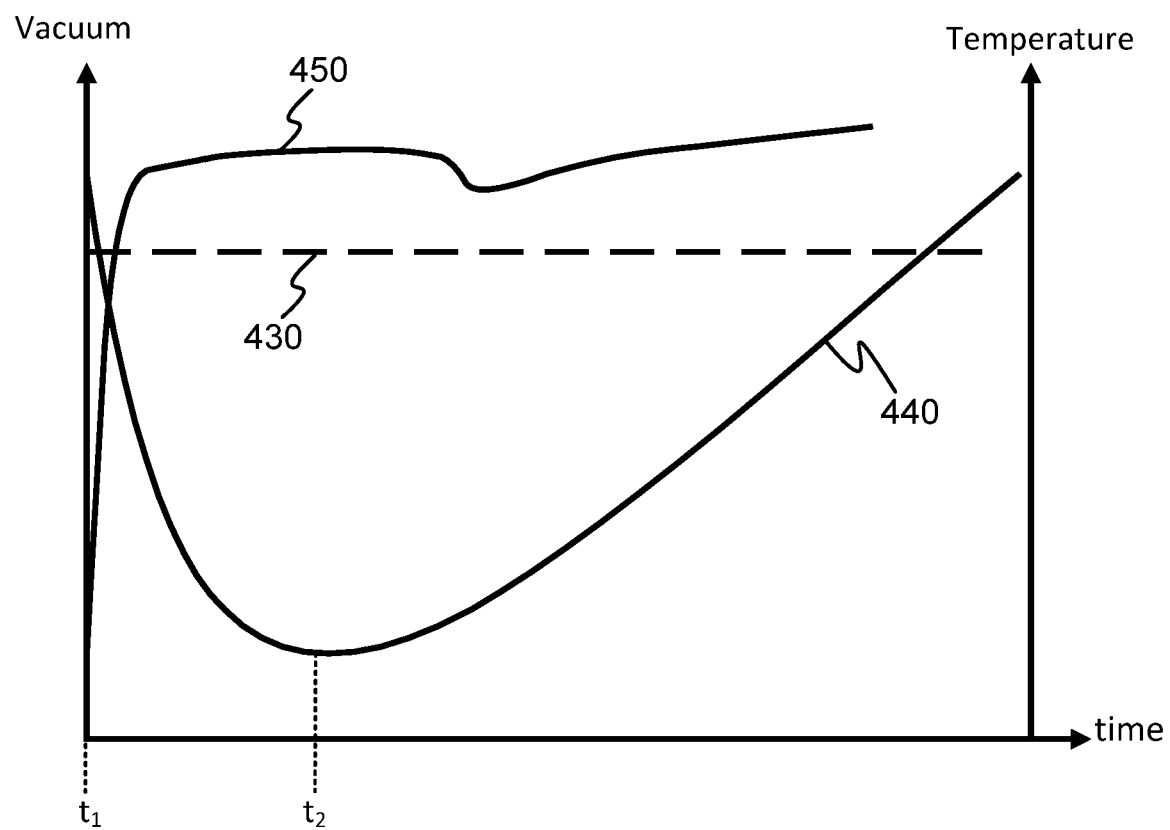

Reference is now made to FIGS. 4A, 4B, which are graphs illustrating exemplary values of vacuum levels within a chamber (e.g., chamber 101) and temperature of a cooler (e.g., cooler 320) during evacuation of the chamber, consistent with embodiments of the present disclosure. Referring to FIG. 4A, curve 410 is an exemplary plot of temperature of the cooler versus time. Curve 420 is an exemplary plot of corresponding vacuum level within the chamber versus time. Line 430 illustrates minimum vacuum level needed within the chamber for an application (e.g., wafer inspection using electron beam tool 104 housed within chamber 101). Curve 410 illustrates a reduction in temperature of the cooler from a time $t_1$ to a time $t_2$. In some embodiments, a controller (e.g., controller 350) can control the reduction in temperature of the cooler. The cooler can trap gas molecules from the chamber and reduce pressure within the chamber. The reduction in pressure within the chamber or increase in vacuum level of the chamber is illustrated by curve 420. The cooler can therefore increase speed of evacuation of the chamber. Based on the determination of satisfaction of one or more conditions (as described above with reference to FIG. 3), the controller may stop the cooling action of the cooler. The stopping of the cooling action can cause an uncontrolled increase in temperature of the cooler causing a rapid release of trapped gas molecules from the cooler into the chamber. In some embodiments, the rapid release of trapped gas molecules can cause a spike in vacuum level of the chamber below minimum vacuum level 430. For example, FIG. 4A illustrates a drop in vacuum level below minimum vacuum level 430 at a time $t_3$.

Referring back to FIG. 3, controller 350 can control the temperature of cooler 320 to increase at one or more rates. Controller 350 can also set cooling power of cooler 320 based on determined values of temperature of cooler 320 or pressure within chamber 101. In some embodiments, controller 350 can set cooling power of cooler 320 at different time points based on a predicted model of temperature variation (of cooler 320) with respect to time. The model can be based on volume of chamber 101, pumping speed of pump 330, pumping speed of pump 340, volume of cooler 320, operating temperature of cooler 320, and cooling capacity of cooler 320. Accordingly, controller 350 can be configured to increase temperature of cooler 320 at a controlled rate to allow pump 340 and pump 330 to evacuate the trapped gas molecules released from cooler 320. With such arrangements, vacuum levels within chamber 101 can be maintained above a minimum vacuum level needed for some applications (e.g., wafer inspection using electron beam tool 104 housed within chamber 101).

Referring now to FIG. 4B, curve 440 is an exemplary plot of temperature of the cooler versus time. Curve 450 is an exemplary plot of corresponding vacuum level within the chamber versus time. Line 430 illustrates minimum vacuum level needed within the chamber for an application (e.g., wafer inspection using electron beam tool 104 housed within chamber 101). Curve 440 illustrates a reduction in temperature of the cooler from a time $t_1$ to a time $t_2$. In some embodiments, a controller (e.g., controller 350) can control the reduction in temperature of the cooler. The cooler can trap gas molecules from the chamber and reduce pressure within the chamber. The reduction in pressure within the chamber or increase in vacuum level of the chamber is illustrated by curve 450. The cooler can therefore increase speed of evacuation of the chamber. Based on the determination of satisfaction of one or more conditions (as described above with reference to FIG. 3), the controller can control the rate of increase of temperature of the cooler. The rate can be determined as described above with reference to controller 350 of FIG. 3. The increase in temperature of the cooler can cause a release of trapped gas molecules from the cooler into the chamber. However, the controller can control the rate of increase of temperature of the cooler (from time $t_2$ onwards) to maintain vacuum level within the chamber above minimum vacuum level 430 (as illustrated by curve 450).

Figure 5:
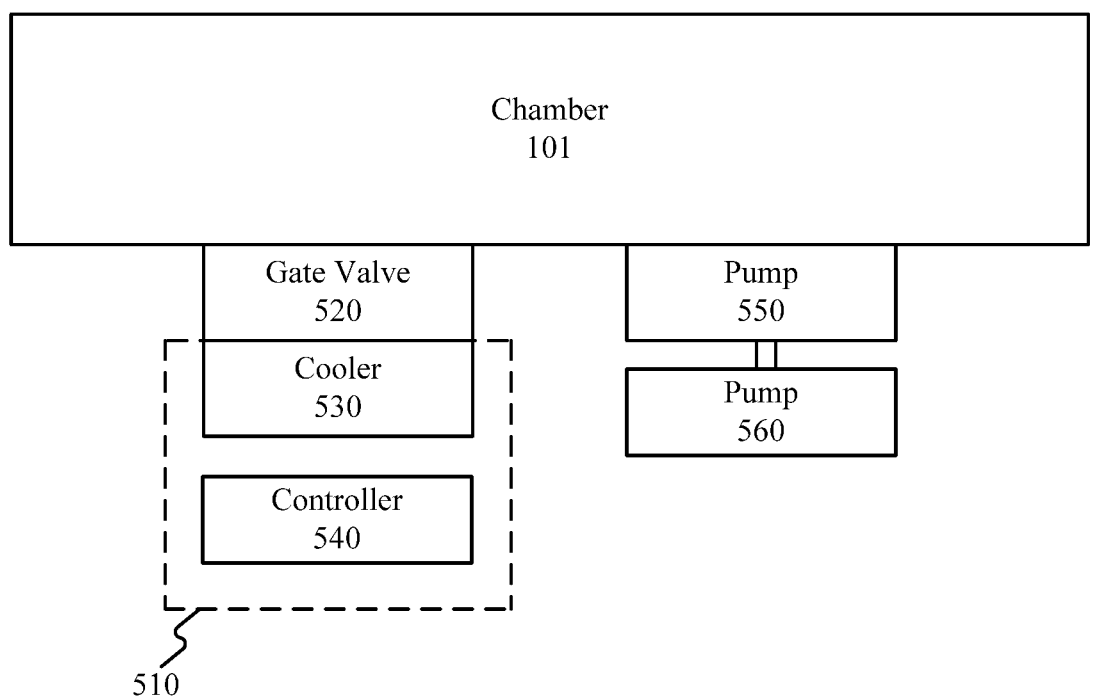
FIG. 5 is a schematic diagram illustrating another exemplary system for evacuating a chamber, consistent with embodiments of the present disclosure.

Reference is now made to FIG. 5, which is a schematic diagram illustrating an exemplary system 510 for evacuating a chamber (e.g., chamber 101), consistent with embodiments of the present disclosure. System 510 can comprise a controller 540 and a cooler 530. Controller 540 can, similar to controller 350, comprise a control module. Cooler 530 can be similar to cooler 320. Cooler 530 can be coupled to chamber 101 via a gate valve 520. Gate valve 520 can be controlled by a controller (e.g., controller 540) to an open position to expose cooler 530 to chamber 101. Gate valve 520 can also be controlled by a controller (e.g., controller 540) to a closed position to isolate cooler 530 from chamber 101. Chamber 101 can be coupled to a roughing pump, e.g. pump 560. Pump 560 can be similar to pump 340 and configured to evacuate chamber 101 from a high pressure (e.g. atmospheric pressure) to a rough vacuum level (e.g. chamber pressure of $10^{-3}$ torr). A reduction in temperature of cooler 530 can reduce pressure of gas molecules within cooler 530 and draw in gas molecules from chamber 101 into cooler 530. The drawing in of gas molecules from chamber 101 into cooler 530 can reduce the pressure (or increase the vacuum level) within chamber 101. Cooler 530 can therefore speed up evacuation of chamber 101 by drawing in gas molecules from chamber 101 and trapping them within itself. In some embodiments, controller 540 can be configured to control the reduction in temperature of cooler 530.

Chamber 101 can also be coupled to a high vacuum pump, e.g. pump 550. Pump 550 can be any high vacuum pump similar to pump 330 and configured to evacuate chamber 101 from a rough vacuum level (e.g. $10^{-3}$ torr) to a high vacuum level (e.g. base pressure of $10^{-6}$ torr). In some embodiments, pump 550 can be a turbomolecular pump. A controller (e.g. controller 540) can be configured to control pump 550 to evacuate chamber 101 from rough vacuum to base pressure.

In some embodiments, mechanical vibrations associated with operation of cooler 530 may interfere with applications of chamber 101. For example, the vibrations can interfere with operation of electron beam tool 104 housed within chamber 101. Controller 540 can be configured to determine whether a property of cooler 530 or chamber 101 satisfies one or more conditions. Controller 540 can be further configured to stop cooling operation of cooler 530 (and eliminate associated vibrations) based on the satisfaction of the one or more conditions. For example, the determined property of chamber 101 may be pressure within chamber 101 and one of the conditions can be that pressure within chamber 101 is below a threshold pressure of $10^{-6}$ torr. In some embodiments, the determined property of cooler 530 may be temperature of cooler 530 and one of the conditions can be that the temperature of cooler 530 is below a threshold temperature of 65K.

Based on the satisfaction of one or more conditions, controller 540 can isolate cooler 530 from chamber 101. Controller 540 can isolate cooler 530 from chamber 101 by controlling gate valve 520 to a closed position. In some embodiments, cooler 530 can be decoupled from chamber 101. Cooler 530 may further be moved to a different location after the decoupling. Controller 540 can also be configured to stop the cooling operation of cooler 530, causing temperature of cooler 530 to increase to ambient temperature. The isolation of cooler 530 from chamber 101 can prevent release of trapped gas molecules from cooler 530 into chamber 101 during the increase of temperature of cooler 530.

Figure 6:
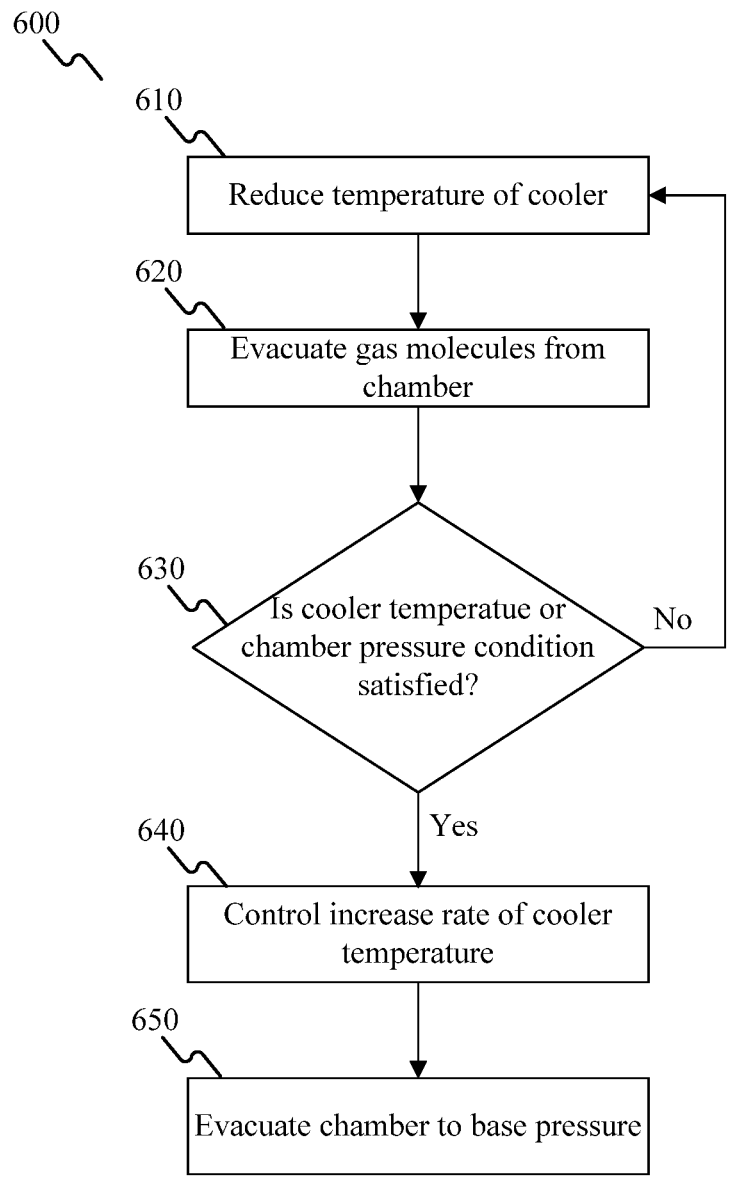
FIG. 6 is a flowchart illustrating an exemplary method for evacuating a chamber, consistent with embodiments of the present disclosure.

FIG. 6 is a flowchart illustrating an exemplary method 600 for evacuating a chamber (e.g. chamber 101), consistent with embodiments of the present disclosure. As an example, method 600 can be performed by a system (e.g., system 310 of FIG. 3, comprising cooler 320 and controller 350), for evacuating a chamber (e.g., chamber 101). It will be readily appreciated that the illustrated procedure can be altered to modify the order of steps, delete steps, or further include additional steps.

After an initial start, temperature of a cooler (e.g., cooler 320) is reduced, in step 610. In some embodiments, a controller (e.g., controller 350) can control the reduction in temperature of the cooler. The cooling action can reduce pressure of gas molecules within the cooler and draw in gas molecules from the chamber (e.g., chamber 101) into the cooler. The cooler can therefore speed up evacuation of the chamber by drawing in gas molecules from the chamber and trapping them within the cooler.

In step 620, the controller can further evacuate the chamber by controlling operations of a roughing pump (e.g., pump 340) connected to the chamber. The combined action of the cooler and the roughing pump can evacuate gas molecules from the chamber and reduce pressure within the chamber.

In step 630, the controller can determine whether a property of the cooler or the chamber satisfies one or more conditions. The controller can control operations of the cooler based on the satisfaction of the one or more conditions. For example, the determined property of the chamber may be pressure within the chamber and one of the conditions can be that pressure within the chamber is below a threshold pressure of $10^{-3}$ torr. In some embodiments, the determined property of the cooler may be temperature of the cooler and one of the conditions can be that temperature of the cooler is below a threshold temperature of 65K. If the one or more conditions are not satisfied, the controller can further control reduction in temperature of the cooler and evacuation of gas molecules from the chamber.

In step 640, the controller can control the temperature of the cooler to increase at one or more rates based on the satisfaction of the one or more conditions in step 630. As described above with reference to FIG. 4, trapped gas molecules within the cooler can escape back into the chamber during the increase of temperature of the cooler. This can cause vacuum level within the chamber to fall below a minimum vacuum level needed for some applications (e.g., wafer inspection using electron beam tool 104 housed within chamber 101). In step 640, the controller can set cooling power of the cooler based on determined values of temperature of the cooler or pressure within the chamber. In some embodiments, the controller can set cooling power of the cooler at different time points based on a predicted model of temperature variation of the cooler with respect to time. The model can be based on volume of the chamber, pumping speed of the one or more pumps coupled to the chamber, volume of the cooler, operating temperature of the cooler, and cooling capacity of the cooler. Referring to FIG. 4B, curve 440 can represent a controlled increase rate of temperature of the cooler in step 640. Curve 450 can represent a corresponding vacuum level within the chamber.

In step 650, the controller can control operation of the roughing pump and a high vacuum pump (e.g., pump 330) to evacuate the chamber to a base pressure value. The high vacuum pump (e.g., a turbomolecular pump) can be configured to evacuate the chamber from a rough vacuum level (e.g., $10^{-3}$ torr) to a high vacuum level (e.g., base pressure of $10^{-6}$ torr). In some embodiments, the high vacuum pump may evacuate gas molecules from the chamber via the cooler. The high vacuum pump can also evacuate the trapped gas molecules released from the cooler during increase of temperature of the cooler in step 640.

Figure 7:
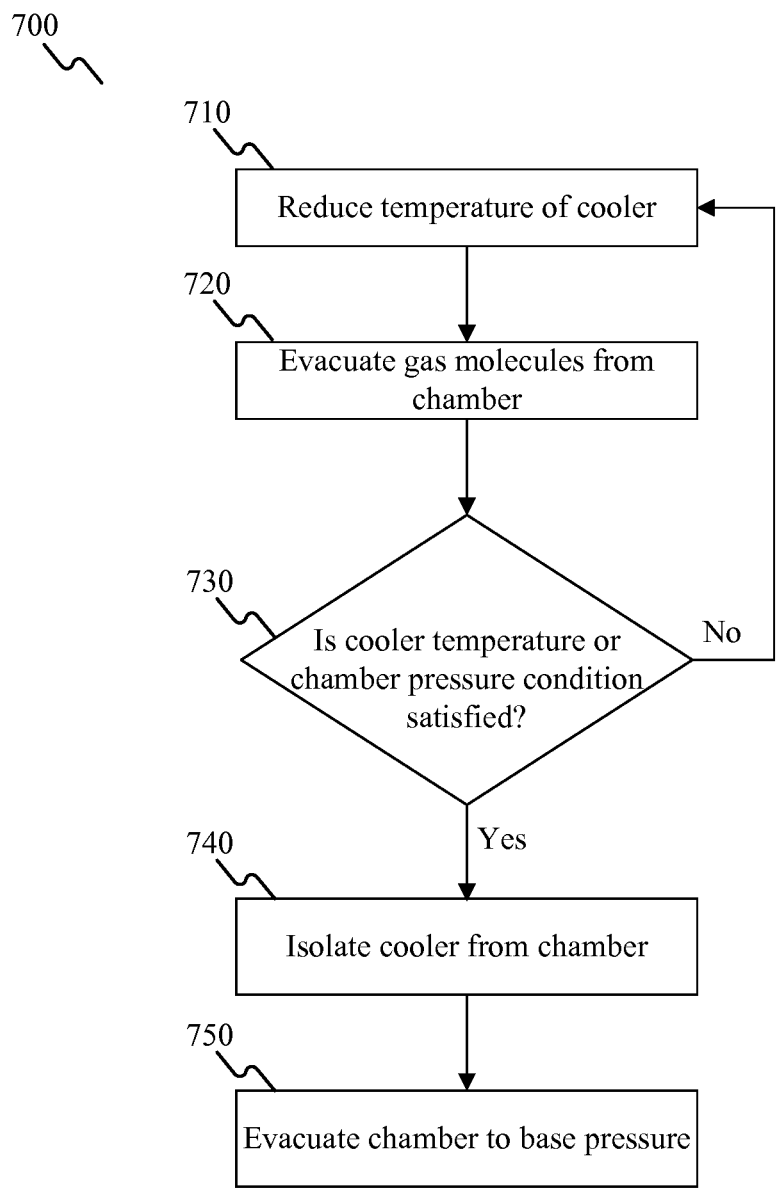
FIG. 7 is a flowchart illustrating another exemplary method for evacuating a chamber, consistent with embodiments of the present disclosure.

FIG. 7 is a flowchart illustrating an exemplary method 700 for evacuating a chamber (e.g., chamber 101), consistent with embodiments of the present disclosure. As an example, method 700 can be performed by system 510 (comprising cooler 530 and controller 540) for evacuating a chamber. It will be readily appreciated that the illustrated procedure can be altered to modify the order of steps, delete steps, or further include additional steps.

After an initial start, temperature of a cooler (e.g., cooler 530) is reduced, in step 710. In some embodiments, a controller (e.g., controller 540) can control the reduction in temperature of the cooler. The cooling action can reduce pressure of gas molecules within the cooler and draw in gas molecules from the chamber into the cooler. The drawing in of gas molecules from the chamber into the cooler can reduce the pressure (or increase the vacuum level) within the chamber. The cooler can therefore speed up evacuation of the chamber by drawing in gas molecules from the chamber and trapping them within the cooler.

In step 720, the controller can further evacuate the chamber by controlling operation of a roughing pump (e.g., pump 560) coupled to the chamber. In some embodiments, the controller can further control operation of a high vacuum pump (e.g., pump 550) coupled to the chamber to evacuate the chamber to base pressure. The high vacuum pump (e.g., a turbomolecular pump) can be configured to evacuate the chamber from a rough vacuum level (e.g., $10^{-3}$ torr) to a high vacuum level (e.g., base pressure of $10^{-6}$ torr). The combined action of the cooler, the roughing pump, and the high vacuum pump can evacuate gas molecules from the chamber and reduce pressure within the chamber.

In step 730, the controller can determine whether a property of the cooler or the chamber satisfies one or more conditions. The controller can control operation of the cooler based on the satisfaction of the one or more conditions. For example, the determined property of the chamber may be a pressure within the chamber and one of the conditions can be that pressure within the chamber is below a threshold pressure of $10^{-6}$ torr. In some embodiments, the determined property of the cooler may be a temperature of the cooler and one of the conditions can be that temperature of the cooler is below a threshold temperature of 65K. If the one or more conditions are not satisfied, the controller can further control reduction in temperature of the cooler and evacuation of gas molecules from the chamber.

In step 740, the controller can isolate the cooler based on the satisfaction of the conditions in step 730. The controller can isolate the cooler from the chamber by closing a gate valve (e.g., gate valve 520). The controller can further stop the cooling operation of the cooler causing temperature of the cooler to increase to ambient temperature. The isolation of the cooler from the chamber can prevent release of trapped gas molecules from the cooler into the chamber during the rise of temperature of the cooler.

In step 750, the controller can control operation of the roughing pump and the high vacuum pump to further evacuate gas molecules from the chamber and maintain base pressure within the chamber.

The embodiments may further be described using the following clauses:

1. A system comprising:
a cooler coupled with a chamber; and
a controller, wherein the controller is configured to:
determine whether a property of the cooler or the chamber satisfies one or more conditions, and
based on the determination that the property satisfies the one or more conditions:
control the temperature of the cooler to increase at one or more rates, and
control one or more pumps to pump the chamber to a base pressure value.

2. The system of clause 1, wherein the controller is further configured to control a reduction of temperature of the cooler.

3. The system of clauses 1 or 2, wherein the property includes at least one of a temperature of the cooler and a pressure within the chamber.

4. The system of clause 3, wherein the one or more conditions comprise at least one of:
the determined temperature of the cooler being lower than a first temperature threshold; and
the determined pressure within the chamber being lower than a first pressure threshold.

5. The system of any one of clauses 1-4, wherein controlling the temperature of the cooler to increase at one or more rates comprises the controller being configured to:
set cooling power of the cooler at different time points based on a predicted model of temperature variation with respect to time, the model being based on a volume of the chamber, a pumping speed of the one or more pumps, a volume of the cooler, an operating temperature of the cooler, and a cooling capacity of the cooler.

6. The system of any one of clauses 1-5, wherein controlling the temperature of the cooler to increase at one or more rates comprises the controller being configured to:
determine a value of at least one of the temperature of the cooler and the pressure within the chamber; and
set cooling power of the cooler based on the determined value.

7. The system of any one of clauses 1-6, wherein the one or more pumps comprise a roughing pump and a high vacuum pump.

8. The system of clause 7, wherein the high vacuum pump includes a turbomolecular pump.

9. The system of clauses 7 or 8, wherein the high vacuum pump is coupled in series with the cooler.

10. The system of clauses 7 or 8, wherein the high vacuum pump is coupled in parallel with the cooler.

11. The system of any one of clauses 1-10, wherein the chamber is coupled with an electron beam inspection tool.

12. A system comprising:
a cooler coupled with a chamber; and
a controller, wherein the controller is configured to:
determine whether a property of the cooler or the chamber satisfies one or more conditions, and
based on the determination that the property satisfies the one or more conditions:
isolate the cooler from the chamber, and
control one or more pumps to pump the chamber to a base pressure value.

13. The system of clause 12, wherein the controller is further configured to control a reduction of temperature of the cooler.

14. The system of clauses 12 or 13, wherein the property includes at least one of a temperature of the cooler and a pressure within the chamber.

15. The system of clause 14, wherein the one or more conditions comprise at least one of:
the determined temperature of the cooler being lower than a first temperature threshold; and
the determined pressure within the chamber being lower than a first pressure threshold.

16. The system of any one of clauses 12-15, further comprising a gate valve disposed between the cooler and the chamber, wherein the gate valve is configured to isolate the cooler from the chamber.

17. The system of clause 16, wherein the system is configured to decouple the cooler from the chamber.

18. The system of any one of clauses 12-17, wherein the one or more pumps comprise a roughing pump and a high vacuum pump.

19. The system of clause 18, wherein the high vacuum pump includes a turbomolecular pump.

20. The system of any one of clauses 12-19, wherein the chamber is coupled with an electron beam inspection tool.

21. A method comprising:
determining whether a property of a cooler coupled with a chamber or the chamber satisfies one or more conditions; and
based on the determination that the property satisfies the one or more conditions:
controlling the temperature of the cooler to increase at one or more rates, and
controlling one or more pumps to pump the chamber to a base pressure value.

22. The method of clause 21, further comprising controlling a reduction of temperature of the cooler.

23. The method of clauses 21 or 22, wherein the property includes at least one of the temperature of the cooler and a pressure within the chamber.

24. The method of clause 23, wherein the one or more conditions comprise at least one of:
the determined temperature of the cooler being lower than a first temperature threshold; and the determined pressure within the chamber being lower than a first pressure threshold.

25. The method of any one of clauses 21-24, wherein controlling the temperature of the cooler to increase at one or more rates comprises:

setting cooling power of the cooler at different time points based on a predicted model of temperature variation with respect to time, the model being based on a volume of the chamber, a pumping speed of the one or more pumps, a volume of the cooler, an operating temperature of the cooler, and a cooling capacity of the cooler.

26. The method of any one of clauses 21-25, wherein controlling the temperature of the cooler to increase at one or more rates comprises:

determining a value of at least one of the temperature of the cooler and the pressure within the chamber; and setting cooling power of the cooler based on the determined value.

27. The method of any one of clauses 21-26, wherein the one or more pumps comprise a roughing pump and a high vacuum pump.

28. The method of clause 27, wherein the high vacuum pump includes a turbomolecular pump.

29. The method of any one of clauses 21-28, wherein controlling the one or more pumps to pump the chamber to the base pressure value comprises drawing out gas molecules from the chamber via the cooler.

30. The method of any one of clauses 21-29, wherein the method is implemented by a computer.

31. The method of any one of clauses 21-30, further comprising:

determining whether a pressure within the chamber reaches the base pressure value; and based on the determination that the pressure reaches the base pressure value, operating the chamber to hold a wafer before an electron beam inspection operation occurs.

32. A method comprising:

determining whether a property of a cooler coupled with a chamber or the chamber satisfies one or more conditions; and based on the determination that the property satisfies the one or more conditions:

isolating the cooler from the chamber, and controlling one or more pumps to pump the chamber to a base pressure value.

33. The method of clause 32, further comprising controlling a reduction of temperature of the cooler.

34. The method of clauses 32 or 33, wherein isolating the cooler from the chamber comprises closing a gate valve disposed between the cooler and the chamber.

35. The method of any one of clauses 32-34, wherein the property includes at least one of the temperature of the cooler and a pressure within the chamber.

36. The method of clause 35, wherein the one or more conditions comprise at least one of:

the determined temperature of the cooler being lower than a first temperature threshold; and the determined pressure within the chamber being lower than a first pressure threshold.

37. The method of any one of clauses 32-36, wherein the one or more pumps comprise a roughing pump and a high vacuum pump.

38. The method of clause 37, wherein the high vacuum pump includes a turbomolecular pump.

39. The method of any one of clauses 32-38, wherein the method is implemented by a computer.

40. The method of any one of clauses 32-39, further comprising:

determining whether a pressure within the chamber reaches the base pressure value; and based on the determination that the pressure reaches the base pressure value, operating the chamber to hold a wafer before an electron beam inspection operation occurs.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A system comprising:
a cooler coupled with a chamber; and a controller, wherein the controller is configured to:
determine whether a property of the cooler or the chamber satisfies one or more conditions, and
based on the determination that the property satisfies the one or more conditions:
control the temperature of the cooler to increase at one or more rates, and control one or more pumps to pump the chamber to a base pressure value, wherein controlling the temperature of the cooler to increase at one or more rates comprises the controller being configured to:
set cooling power of the cooler at different time points based on a predicted model of temperature variation with respect to time, the model being based on a volume of the chamber, a pumping speed of the one or more pumps, a volume of the cooler, an operating temperature of the cooler, and a cooling capacity of the cooler.

2. The system of claim 1, wherein the controller is further configured to control a reduction of temperature of the cooler.

3. The system of claim 1, wherein the property includes at least one of a temperature of the cooler and a pressure within the chamber.

4. The system of claim 3, wherein the one or more conditions comprise at least one of:
the determined temperature of the cooler being lower than a first temperature threshold; and
the determined pressure within the chamber being lower than a first pressure threshold.

5. The system of claim 1, wherein controlling the temperature of the cooler to increase at one or more rates comprises the controller being configured to:
determine a value of at least one of the temperature of the cooler and the pressure within the chamber; and
set cooling power of the cooler based on the determined value.

6. The system of claim 1, wherein the one or more pumps comprise a roughing pump and a high vacuum pump.

7. The system of claim 6, wherein the high vacuum pump includes a turbomolecular pump.

8. The system of claim 6, wherein the high vacuum pump is coupled in series with the cooler.

9. The system of claim 6, wherein the high vacuum pump is coupled in parallel with the cooler.

10. The system of claim 1, wherein the chamber is coupled with an electron beam inspection tool.

11. A system of claim 1, wherein the chamber is configured to hold a wafer before an electron beam inspection.

12. The system of claim 1, further comprising a gate valve disposed between the cooler and the chamber, wherein the gate valve is configured to isolate the cooler from the chamber.

13. The system of claim 12, wherein the system is configured to decouple the cooler from the chamber.

14. The system of claim 1 wherein controlling the one or more pumps to pump the chamber to the base pressure value comprises the controller being configured to: draw out gas molecules from the chamber via the cooler.

* * * * *